United States Patent [19]
Mihara et al.

[11] Patent Number: 5,872,476
[45] Date of Patent: Feb. 16, 1999

[54] LEVEL CONVERTER CIRCUIT GENERATING A PLURALITY OF POSITIVE/NEGATIVE VOLTAGES

[75] Inventors: Masaaki Mihara; Yasuhiko Taito, both of Hyogo, Japan

[73] Assignee: Mitsubishi Denki Kabushiki Kaisha, Tokyo, Japan

[21] Appl. No.: 716,846

[22] Filed: Sep. 10, 1996

[30] Foreign Application Priority Data

Jan. 9, 1996 [JP] Japan .................................. 8-001248

[51] Int. Cl.$^6$ .......................... H03L 5/00; H03K 19/0175
[52] U.S. Cl. ............................. 327/333; 327/434; 326/81
[58] Field of Search .................................. 327/407–413, 327/333, 434; 326/81

[56] References Cited

U.S. PATENT DOCUMENTS

| | | | |
|---|---|---|---|
| 3,801,831 | 4/1974 | Dame | 326/81 |
| 4,675,544 | 6/1987 | Schrenk | 326/81 |
| 5,399,915 | 3/1995 | Yahata | 327/333 |
| 5,399,928 | 3/1995 | Lin et al. | 327/434 |
| 5,408,147 | 4/1995 | Yarbrough et al. | 326/81 |
| 5,510,731 | 4/1996 | Dingwall | 327/333 |
| 5,559,464 | 9/1996 | Orii et al. | 327/333 |
| 5,587,676 | 12/1996 | Chowdhury | 327/333 |
| 5,619,150 | 4/1997 | Briner | 327/434 |

FOREIGN PATENT DOCUMENTS 5-136685  6/1993  Japan ........................... H03K 19/00

*Primary Examiner*—Toan Tran
*Attorney, Agent, or Firm*—McDermott, Will & Emery

[57] ABSTRACT

A level converter circuit includes a first CVSL (Cascade Voltage Switch Logic) circuit responsive to a voltage switching signal for providing a power supply voltage or an input voltage, and a second CVSL circuit responsive to a voltage equal to the power supply voltage or input voltage output from the first CVSL circuit for providing a positive input voltage or a negative input voltage. The level converter circuit can supply high positive and negative voltages required for a flash memory.

4 Claims, 16 Drawing Sheets

5,872,476

LEVEL CONVERTER CIRCUIT GENERATING A PLURALITY OF POSITIVE/NEGATIVE VOLTAGES

BACKGROUND OF THE INVENTION

1. Field of the Invention

The present invention relates to a level converter circuit, and more particularly, to a level converter circuit for a flash memory.

2. Description of the Background Art

In a flash memory, a voltage of various levels must be applied to a memory cell. In the case of a DINOR type flash memory, for example, various voltages of a level indicated in the following Table 1 must be applied to a bit line, a word line, and a source line in various operation modes. In Table 1, the voltage at the left side of the slash sign is supplied at a select state, and the voltage at the right side of the slash sign is applied at a de-select state.

TABLE 1

|  | Bit line | Word line | Source line |
| --- | --- | --- | --- |
| Program | 6V/0V | −9V/0V | Floating |
| Erase | Floating | 10V/0V | −9V |
| Read | 1V | 3.3V/0V | 0V |

Referring to Table 1, a voltage of 6V and a voltage of −9V are applied to a bit line and a word line, respectively, and a source line is set to a floating state for a selected memory cell in a program operation mode. For a de-selected memory cell, a voltage of 0V is applied to the bit line and the word line, and the source line is set to a floating state.

In an erase operation mode, the bit line is set to a floating state, and a voltage of 10V and a voltage of −9V are applied to the word line and the source line, respectively, for a selected memory cell. For a de-selected memory cell, the bit line is set to a floating state, and a voltage of 0V and a voltage of −9V are applied to the word line and the source line, respectively.

In a read operation mode, a voltage of 1V, a voltage of 3.3V, and a voltage of 0V are applied to the bit line, the word line, and the source line, respectively, for a selected memory cell. For a de-selected memory cell, a voltage of 1V is applied to the bit line, and a voltage of 0V is applied to the word line and the source line.

It is appreciated that a level converter circuit for supplying a voltage of various levels is required. An example of a conventional level converter circuit is shown in FIG. 16.

Referring to FIG. 16, a level converter circuit 501 includes cross-coupled P channel MOS transistors 507 and 508, and N channel MOS transistors 509 and 510 turned on/off in a complementary manner in response to a voltage switching signal Vin.

When voltage switching signal Vin of an H (logical high) level is applied, N channel MOS transistor 510 is turned on. Since this voltage switching signal Vin is applied to the gate of N channel MOS transistor 509 via an inverter 511, N channel MOS transistor 509 is turned off. As a result, the voltage of node 506 is pulled down to a level of ground voltage (0V) GND, whereby P channel MOS transistor 507 is turned on. Therefore, voltage Vpp of a voltage input terminal 102 is provided as an output voltage Vout via P channel MOS transistor 507.

When voltage switching signal Vin of an L (logical low) level is applied, N channel MOS transistor 510 is turned off and N channel MOS transistor 509 is turned on. Therefore, the voltage of node 505 is pulled down to the level of ground voltage GND, whereby P channel MOS transistor 508 is turned on. Here, voltage VPP is applied to the gate of P channel MOS transistor 507 via P channel MOS transistor 508, whereby P channel MOS transistor 507 is turned off. Therefore, ground voltage GND is provided as output voltage Vout via N channel MOS transistor 509.

Thus, level converter circuit 501 provides an output voltage Vout of a VPP level in response to voltage switching signal Vin of an H level, or output voltage Vout of a ground level in response to voltage switching signal Vin of an L level. A circuit that converts the voltage level by switching cross-coupled transistors 507 and 508 as shown in FIG. 16 is referred to as a cascade voltage switch logic (CVSL) circuit.

By using this CVSL circuit, a level converter circuit that generates only a positive voltage with an amplitude between the level of VPP and ground can be implemented. However, this level converter circuit cannot selectively generate positive and negative voltages as shown in Table 1.

SUMMARY OF THE INVENTION

An object of the present invention is to provide a level converter circuit that can selectively output a positive and a negative voltage.

According to the present invention, a level converter circuit includes first and second cascade voltage switch logic circuits. The first cascade voltage switch logic circuit receives a first voltage and a second voltage different from the first voltage, and responds to a voltage switching signal to selectively output first and second voltages. The second cascade voltage switch logic circuit receives a third voltage differing from the first and second voltages and the first voltage, and responds to a voltage provided from the first cascade voltage switch logic circuit to selectively output first and third voltages.

Thus, the level converter circuit of the present invention can selectively output first and second voltages.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
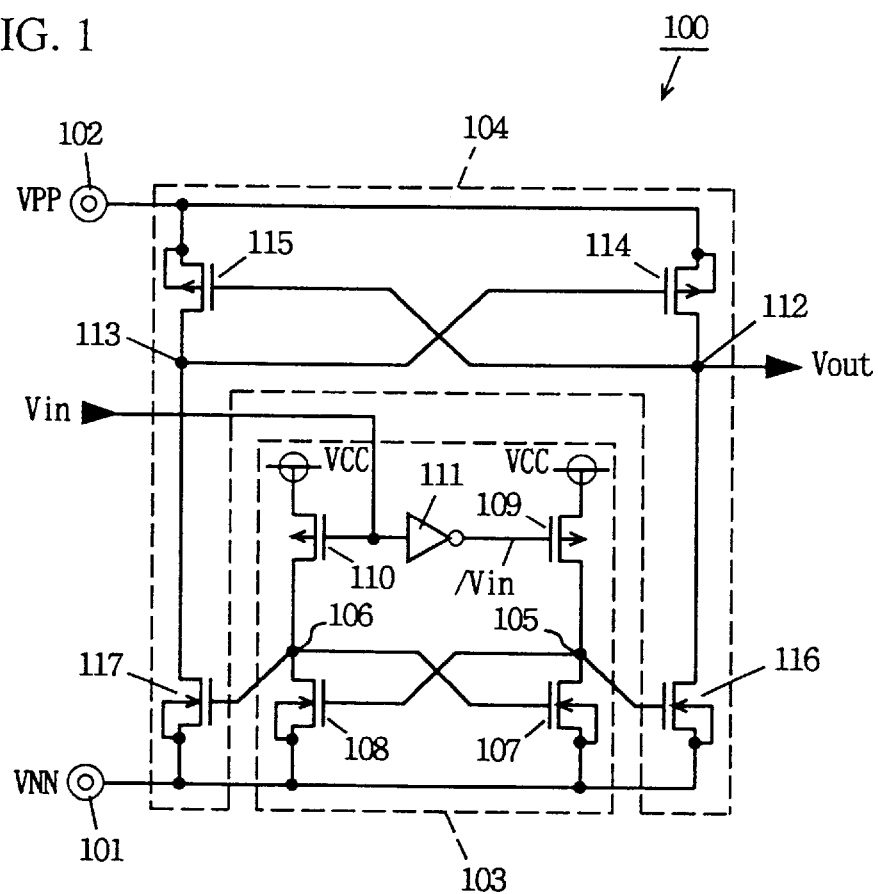
FIG. 1 is a circuit diagram showing a structure of a level converter circuit according to a first embodiment of the present invention.

Embodiments of the present invention will be described in detail with reference to the drawings. In the drawings, like reference numerals indicate the same or corresponding components.

First Embodiment

Referring to FIG. 1, a level converter circuit 100 according to a first embodiment of the present invention includes a voltage input terminal 101 for receiving an input voltage VNN, and a voltage input terminal 102 for receiving an input voltage VPP. Level converter circuit 100 further includes a cascade voltage switch logic (CVSL) circuit 103 receiving input voltage VNN and a power supply voltage VCC, and responsive to a voltage switching signal Vin for selectively providing input voltage VNN and power supply voltage VCC, and a CVSL circuit 104 receiving input voltage VPP and input voltage VNN, and responsive to voltage VNN or VCC provided from CVSL circuit 103 for selectively providing input voltage VNN and VPP.

CVSL circuit 103 includes cross-coupled N channel MOS transistors 107 and 108, a P channel MOS transistor 109 for pulling up the drain voltage of N channel MOS transistor 107 to the level of power supply voltage VCC, a P channel MOS transistor 110 for pulling up the drain voltage of N channel MOS transistor 108 to the level of power supply voltage VCC, and an inverter 111 for inverting the logic level of voltage switching signal Vin for providing a voltage switching signal /Vin complementary to voltage switching signal Vin. N channel MOS transistor 107 has a source connected to voltage input terminal 101, a drain connected to a node 105, a gate connected to a node 106, and a backgate connected to its source. N channel MOS transistor 108 has a source connected to voltage input terminal 101, a drain connected to node 106, a gate connected to node 105, and a backgate connected to its source. P channel MOS transistor 109 has a source for receiving power supply voltage VCC, a drain connected to node 105, and a gate receiving voltage switching signal /Vin. P channel MOS transistor 110 has a source receiving power supply voltage VCC, a drain connected to node to node 106, and a gate receiving voltage switching signal Vin.

CVSL circuit 104 includes cross-coupled P channel MOS transistors 114 and 115, an N channel MOS transistor 116 for pulling down the drain voltage of P channel MOS transistor 114 to the level of input voltage VNN, and an N channel MOS transistor 117 for pulling down the drain voltage of P channel MOS transistor 115 to the level of input voltage VNN. P channel MOS transistor has its source connected to a voltage input terminal 102, its drain connected to a node 112, its gate connected to a node 113, and a backgate connected to its source. P channel MOS transistor 115 has its source connected to voltage input terminal 102, its drain connected to node 113, its gate connected to node 112, and a backgate connected to its source. N channel MOS transistor 116 has its source connected to voltage input terminal 101, its drain connected to node 112, its gate connected to node 105, and a backgate connected to its source. N channel MOS transistor 117 has its source connected to voltage input terminal 101, its drain connected to node 113, its gate connected to node 106, and a backgate connected to its source.

Figure 2:
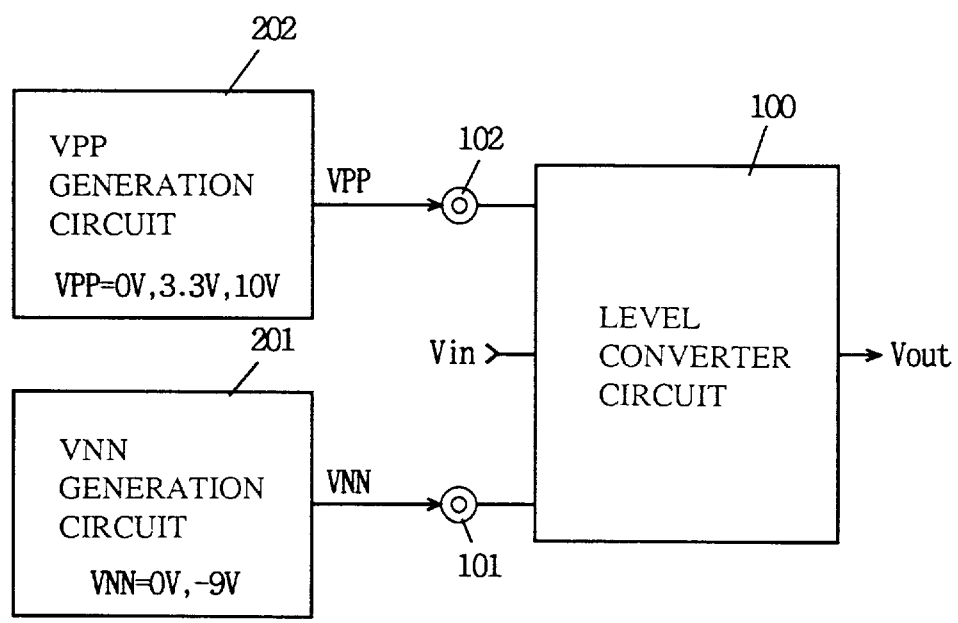
FIG. 2 is a block diagram including the level converter circuit of FIG. 1.

Referring to the block diagram of FIG. 2 including level converter circuit 100 of FIG. 1, voltage VNN from a VNN generator circuit 201 is applied to voltage input terminal 101, and voltage VPP from a VPP generator circuit 202 is applied to voltage input terminal 102. VNN generator circuit 201 generates voltage VNN of 0V or −9V. VPP generator circuit 202 generates voltage VPP of 0V, 3.3V or 10V.

Level converter circuit 100 supplies output voltage Vout to a word line of a flash memory, for example. The following Table 2 shows input voltages VPP and VNN, voltage switching signals Vin and /Vin, the ON/OFF states of transistors 107–110, 116 and 117, and voltages V (105), V (106), V (112), and V (113) of nodes 105, 106, 112, and 113, respectively, in various operation modes of a flash memory. Here, a voltage of 3.3V is applied as power supply voltage VCC.

TABLE 2

|  | VPP | VNN | Vin | /Vin | 109 | 108 | V(106) | 116 | V(112) = Vout | 110 | 107 | V(105) | 117 | V(113) |
|---|---|---|---|---|---|---|---|---|---|---|---|---|---|---|
| Program (selected) | 0 | −9 | 3.3 | 0 | On | On | −9 | On | −9 | Off | Off | 3.3 | Off | 0 |
| Program (de-selected) | 0 | −9 | 0 | 3.3 | Off | Off | 3.3 | Off | 0 | On | On | −9 | On | −9 |
| Erase (selected) | 10 | 0 | 0 | 3.3 | Off | Off | 3.3 | Off | 10 | On | On | 0 | On | 0 |
| Erase (de-selected) | 10 | 0 | 0 | 0 | On | On | 0 | On | 0 | Off | Off | 3.3 | Off | 10 |
| Read (selected) | 3.3 | 0 | 0 | 3.3 | Off | Off | 3.3 | Off | 3.3 | On | On | 0 | On | 0 |
| Read (de-selected) | 3.3 | 0 | 3.3 | 0 | On | On | 0 | On | 0 | Off | Off | 3.3 | Off | 3.3 |

It is appreciated from Table 2 that input voltage VPP of 0V is applied and input voltage VNN of −9V is applied in a program operation mode. In an erase operation mode, input voltage VPP of 10V and input voltage VNN of 0V are applied. In a read operation mode, input voltage VPP of 3.3V and input voltage VNN of 0V are applied.

When voltage switching signal Vin attains the level of 3.3V (H level), P channel MOS transistor 110 is turned off in response to voltage switching signal Vin of an H level, and P channel MOS transistor 109 is turned on in response to voltage switching signal /Vin of an L level complementary to voltage switching signal Vin. This causes the voltage of node 105 to be pulled up to the level of VCC, whereby N channel MOS transistor 108 is turned on. In response, the voltage of node 106 is pulled down to the level of VNN, whereby N channel MOS transistor 107 is turned off.

The voltage of node 105 attaining the level of VCC causes N channel MOS transistor 116 to be turned on, and the voltage of node 106 attaining a level of VNN causes N channel MOS transistor 117 to be turned off. As a result, the voltage of node 112 is pulled down to the level of VNN, whereby P channel MOS transistor 115 is turned on. In response, the voltage of node 113 is pulled up to the level of VPP, whereby P channel MOS transistor 114 is turned off. Therefore, output voltage Vout attains the level of VNN.

When voltage switching signal Vin attains the level of 0V (L level), P channel MOS transistor 110 is turned on in response to voltage switching signal Vin of an L level, and P channel MOS transistor 109 is turned off in response to voltage switching signal /Vin of an H level complementary to voltage switching signal Vin. As a result, the voltage of node 106 is pulled up to the level of VCC, whereby N channel MOS transistor 107 is turned on. In response, the voltage of node 105 is pulled down to the level of VNN, whereby N channel MOS transistor 108 is turned off.

The voltage of node 105 attaining the level of VNN causes N channel MOS transistor 116 to be turned off, and the voltage of node 106 attaining the level of VCC causes N channel MOS transistor 117 to be turned on. As a result, the voltage of node 113 is pulled down to the level of VNN, whereby P channel MOS transistor 114 is turned on. In response, the voltage of node 112 is pulled up to the level of VPP, whereby P channel MOS transistor 115 is turned off. Therefore, output voltage Vout attains the level of VPP.

In a program operation mode, input voltage VPP of 0V and input voltage VNN of −9V are applied. Therefore, output voltage Vout of −9V is applied to the word line of a selected memory cell, and output voltage Vout of 0V is applied to the word line of a de-selected memory cell.

In an erase operation mode, input voltage VPP of 10V and input voltage VNN of 0V are applied. Therefore, output voltage Vout of 10V is applied to the word line of a selected memory cell, and output voltage Vout of 0V is applied to the word line of a de-selected memory cell.

In a read operation mode, input voltage VPP of 3.3V and input voltage VNN of 0V are applied. Therefore, output voltage Vout of 3.3V is applied to the word line of a selected memory cell, and output voltage Vout of 0V is applied to the word line of a de-selected memory cell.

Thus, CVSL circuit 103 provides a voltage that has an amplitude between the level of VCC and VNN, and CVSL circuit 104 provides a voltage that has an amplitude between the level of VPP and VNN. Thus, level converter circuit 100 can supply an output voltage Vout that has an amplitude between a positive VPP level and a negative VNN level.

Voltage switching signal Vin and input voltages VNN and VPP have the following restrictions.

Voltage switching signal Vin must have a value sufficient to control the ON/OFF of P channel MOS transistors 109 and 110. More specifically, voltage switching signal Vin of an H level must have a value greater than "VCC-Vthp". Also, voltage switching signal Vin of an L level must have a value lower than "VCC-Vthp". Here, Vthp is the threshold voltages of P channel MOS transistors 109 and 110. If power supply voltage VCC is 3.3V and the threshold voltage Vthp is 0.8V, voltage switching signal Vin of an H level must be greater than 2.5V, and voltage switching signal Vin of an L level must be lower than 2.5V.

Input voltage VNN must have a value sufficient to control the ON/OFF of N channel MOS transistors 107, 108, 116 and 117 with respect to the voltages of nodes 105 and 106. Specifically, nodes 105 and 106 take the level of VCC as an H level. Therefore, input voltage VNN must have a value lower than "VCC-Vthn". Here, Vthn is the threshold voltages of N channel MOS transistors 107, 108, 116 and 117. Therefore, if power supply voltage VCC is 3.3V and the threshold voltage Vthn is 0.8V, input voltage VNN must be lower than 2.5V.

Furthermore, input voltage VPP must have a value sufficient to control the ON/OFF of P channel MOS transistors 114 and 115 with respect to the voltages of nodes 112 and 113. Specifically, input voltage VCC must have a value smaller than "VPP-Vthp1" since nodes 112 and 113 take the VNN level as a L level. Here, Vthp1 is the threshold voltages of P channel MOS transistors 114 and 115. Since the threshold voltage of a P channel MOS transistor is generally equal within the same circuit, Vthp1 is labeled as "Vthp" hereinafter. Therefore, if input voltage VNN is 0V and the threshold voltage Vthp is 0.8V, input voltage VPP must be greater than 0.8V.

Thus, level converter circuit 100 according to the first embodiment of the present invention can supply output voltage Vout of the levels of 10V, 3.3.V, 0V and −9V. More specifically, level converter circuit 100 can supply a voltage of various amplitudes between a great positive level and a great negative level.

Second Embodiment

In the previous level converter circuit 100 of FIG. 1, some transistors receive a high voltage depending on the operation mode.

In a program operation mode for a selected memory cell, the source voltage of P channel MOS transistor 110 attains the level of 3.3V, and the drain voltage of P channel MOS transistor (i.e. voltage V(106) of node 106, attains the level of −9V. Therefore, a voltage of 12.3V is applied across the source and drain of P channel MOS transistor 110.

In a program operation mode for a de-selected memory cell, the source voltage of P channel MOS transistor 109 attains the level of 3.3V, and the drain voltage of P channel MOS transistor 109, i.e. voltage V(105) of node V(105) attains the level of −9V. Therefore, a voltage of 12.3V is applied across the source and drain of P channel MOS transistor 109.

Figure 3:
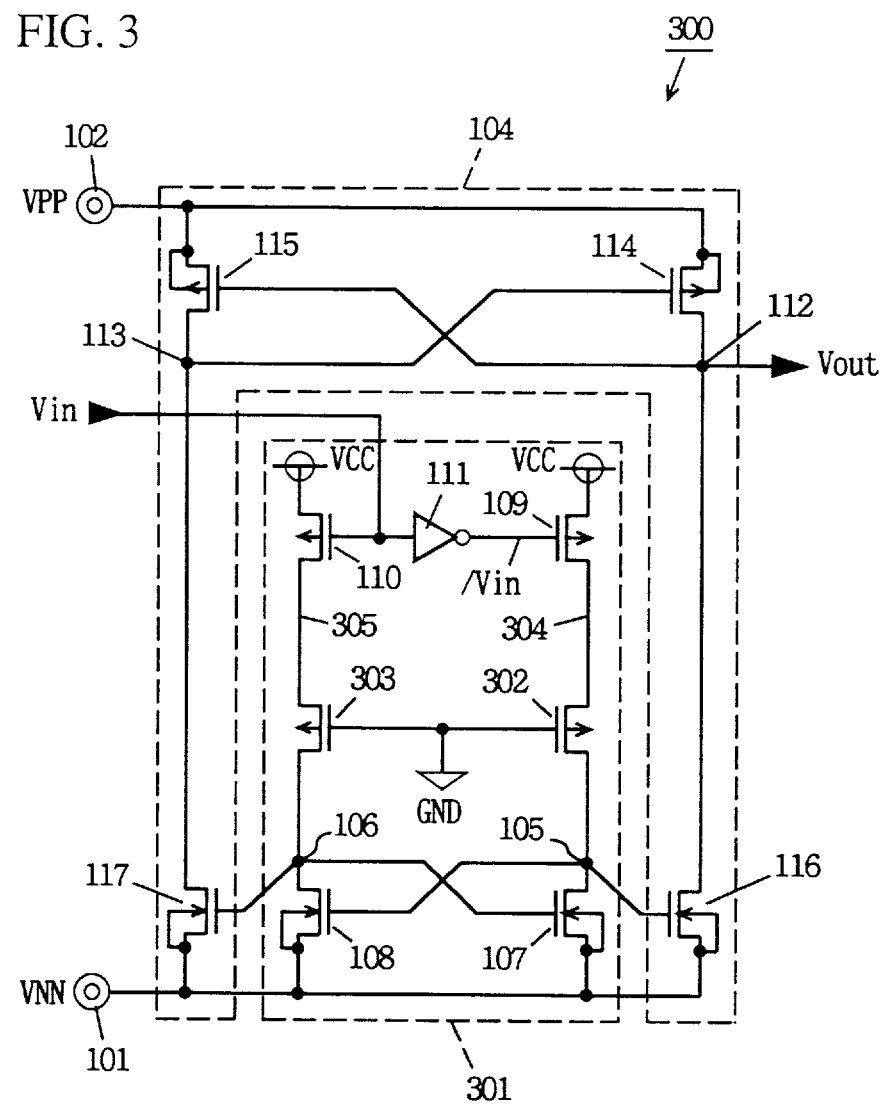
FIGS. 3–15 show a structure of a level converter circuit according to second to fourteenth embodiments, respectively, of the present invention.

An object of the present second embodiment is to relax the voltage between the source and the drain of P channel MOS transistors 109 and 110. Referring to FIG. 3 showing a circuit diagram of a level converter circuit of the second embodiment, a level converter circuit 300 includes a CVSL circuit 301 further including P channel MOS transistors 302 and 303. More specifically, P channel MOS transistors 302 is connected between P channel MOS transistor 109 and N channel MOS transistor 107, and P channel MOS transistor 303 is connected between P channel MOS transistor 110 and N channel MOS transistor 108. Ground voltage GND is applied to the gates of P channel MOS transistors 302 and 303.

The following Table 3 shows input voltages VPP and VNN, voltage switching signals Vin, /Vin, and respective voltages of transistors 107–110 and nodes 105, 106, 304, and 305.

TABLE 3

|  | VPP | VNN | Vin | /Vin | 109 | 108 | V(106) | 110 | 107 | V(105) | 302 | V(304) | 303 | V(305) |
| --- | --- | --- | --- | --- | --- | --- | --- | --- | --- | --- | --- | --- | --- | --- |
| Program (selected) | 0 | −9 | 3.3 | 0 | On | On | −9 | Off | Off | 3.3 | On | 3.3 | Off | 0.8 |
| Program (de-selected) | 0 | −9 | 0 | 3.3 | Off | Off | 3.3 | On | On | −9 | Off | 0.8 | On | 3.3 |
| Erase (selected) | 10 | 0 | 0 | 3.3 | Off | Off | 3.3 | On | On | 0 | Off | 0.8 | On | 3.3 |
| Erase (de-selected) | 10 | 0 | 3.3 | 0 | On | On | 0 | Off | Off | 3.3 | On | 3.3 | Off | 0.8 |
| Read (selected) | 3.3 | 0 | 0 | 3.3 | Off | Off | 3.3 | On | On | 0 | Off | 0.8 | On | 3.3 |
| Read (de-selected) | 3.3 | 0 | 3.3 | 0 | On | On | 0 | Off | Off | 3.3 | On | 3.3 | Off | 0.8 |

In the present level converter circuit 300, P channel MOS transistor 302 is turned off when the voltage of node 105 attains the level of −9V. When the voltage of node 106 attains the level of −9V, P channel MOS transistor 303 is turned off. Therefore, a voltage of only the level of 2.5V (=VCC-Vthp=3.3–0.8) at most is applied across the source and drain of P channel MOS transistors 109 and 110. More specifically, P channel MOS transistors 302 and 303 relax the voltages across respective sources and drains of P channel MOS transistors 109 and 110.

In a program operation mode for a selected memory cell, the source voltage of P channel MOS transistor 303, i.e. voltage V(305) of node 305, attains the level of 0.8V, and the drain of P channel MOS transistor 303, i.e., voltage V(106) of node 106, attains the level of –9V. Therefore, a voltage of 9.8V is applied across the source and drain of P channel MOS transistor 303.

In a program operation mode for a de-selected memory cell, the source voltage of P channel MOS transistor 302, i.e. voltage V(304) of node 304, attains the level of 0.8V, and the drain of P channel MOS transistor 302, i.e. voltage V(105) of node 105, attains the level of –9V. Therefore, a voltage of 9.8V is applied across the source and drain of P channel MOS transistor 302.

Therefore, a voltage greater than 10V will not be applied across the source and the drain of all P channel MOS transistors 109, 110, 302 and 303 within CVSL circuit 301.

By virtue of level converter circuit 300 according to the second embodiment of the present invention including P channel MOS transistors 302 and 303, the voltage across the source and drain of P channel MOS transistors 109 and 110 is relaxed.

Third Embodiment

In level converter circuit 300 of the previous second embodiment shown in FIG. 3, a voltage of 12.3V is applied across the source and drain of N channel MOS transistor 107 since the source voltage of N channel MOS transistor 107 attains the level of –9V, and the drain voltage of N channel MOS transistor 107, i.e. voltage V(105) of node 105, attains the level of 3.3V. Also, a voltage of 12.3V is applied across the source and drain of N channel MOS transistor 108 since the source voltage of N channel MOS transistor 108 attains the level of –9V, and the drain voltage of N channel MOS transistor 108, i.e. voltage V(106) of node 106, attains the level of 3.3V.

Figure 4:
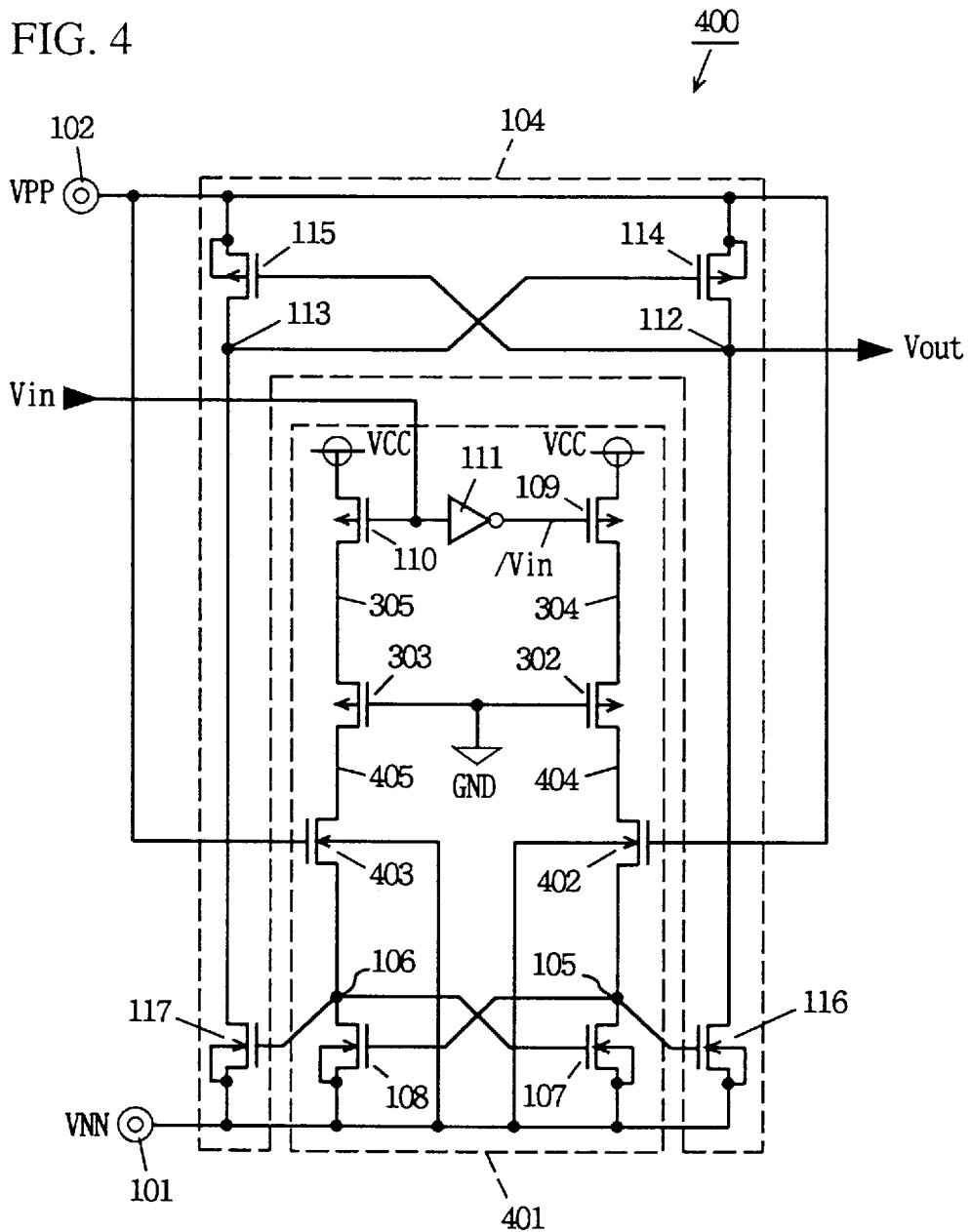

An object of the third embodiment of the present invention is to relax the voltage across the source and drain of N channel MOS transistors 107 and 108. Referring to the circuit diagram of FIG. 4 showing a level converter circuit of a third embodiment, a level converter circuit 400 includes a CVSL circuit 401 further including N channel MOS transistors 402 and 403. N channel MOS transistor 402 is connected between P channel MOS transistor 302 and N channel MOS transistor 107. N channel MOS transistor 403 is connected between P channel MOS transistor 303 and N channel MOS transistor 108. N channel MOS transistor 402 has its gate supplied with input voltage VPP, and its backgate supplied with input voltage VNN. N channel MOS transistor 403 has its gate supplied with input voltage VPP and its backgate supplied with input voltage VNN.

Similar to Tables 2 and 3, the following Table 4 shows input voltages VPP and VNN, voltage switching signal Vin, ON/OFF states of transistors 107, 108, 302, 303, 402 and 403, and respective voltages of nodes 105, 106, 304, 305, 404 and 405.

TABLE 4

| | VPP | VNN | Vin | 108 | V(106) | 107 | V(105) | 302 | V(304) | 303 | V(305) | 402 | V(404) | 403 | V(405) |
|---|---|---|---|---|---|---|---|---|---|---|---|---|---|---|---|
| Program (selected) | 0 | –9 | 3.3 | On | –9 | Off | –0.8 | On | 3.3 | Off | 0.8 | Off | 3.3 | On | –9 |
| Program (de-selected) | 0 | –9 | 0 | Off | –0.8 | On | –9 | Off | 0.8 | On | 3.3 | On | –9 | Off | 3.3 |
| Erase (selected) | 10 | 0 | 0 | Off | 3.3 | On | 0 | Off | 0.8 | On | 3.3 | On | 0 | On | 3.3 |
| Erase (de-selected) | 10 | 0 | 3.3 | On | 0 | Off | 3.3 | On | 3.3 | Off | 0.8 | On | 3.3 | On | 0 |
| Read (selected) | 3.3 | 0 | 0 | Off | 25 | On | 0 | Off | 0.8 | On | 3.3 | On | 0 | Off | 3.3 |
| Read (de-selected) | 3.3 | 0 | 3.3 | On | 0 | Off | 2.5 | On | 3.3 | Off | 0.8 | Off | 3.3 | On | 0 |

In level converter circuit 400, the voltages of nodes 105 and 106 do not become higher than "VPP-Vth". In a program operation mode for a selected memory cell, the source voltage of P channel MOS transistor 303, i.e. voltage V(305) of node 305, attains the level of 0.8V, and the drain voltage of P channel MOS transistor 303, i.e. voltage V(405) of node 405, attains the level of –9V. Therefore, a voltage of 9.8V is applied across the source and drain of P channel MOS transistor 303. Also, the source voltage of N channel MOS transistor 107 attains the level of –9V, and the drain voltage of N channel MOS transistor 107, i.e. voltage V(105) of node 105, attains the level of –0.8V. Therefore, a voltage of 8.2V is applied across the source and drain of N channel MOS transistor 107.

In a program operation mode for a de-selected memory cell, the source voltage of P channel MOS transistor 302, i.e. voltage V(304) of node 304, attains the level of 0.8V, and the drain voltage of P channel MOS transistor 302, i.e. voltage V(404) of node 404, attains the level of –9V. Therefore, a voltage of 9.8V is applied across the source and drain of P channel MOS transistor 302. Also, the source voltage of N channel MOS transistor 108 attains the level of –9V, and the drain voltage of N channel MOS transistor 108, i.e. voltage V(106) of node 106, attains the level of –0.8V. Therefore, a voltage of 8.2V is applied across the source and drain of N channel MOS transistor 108. Therefore, a voltage greater than 10V will not be applied across the source and drain of all transistors 107–110, 302, 303, 402, and 403 in CVSL circuit 401.

By virtue of level converter circuit 400 of the third embodiment including N channel MOS transistors 402 and 403, the voltage across the source and drain of N channel MOS transistors 107 and 108 is relaxed. It is to be noted that P channel MOS transistor 302 and 303 may be omitted.

Fourth Embodiment

Figure 5:
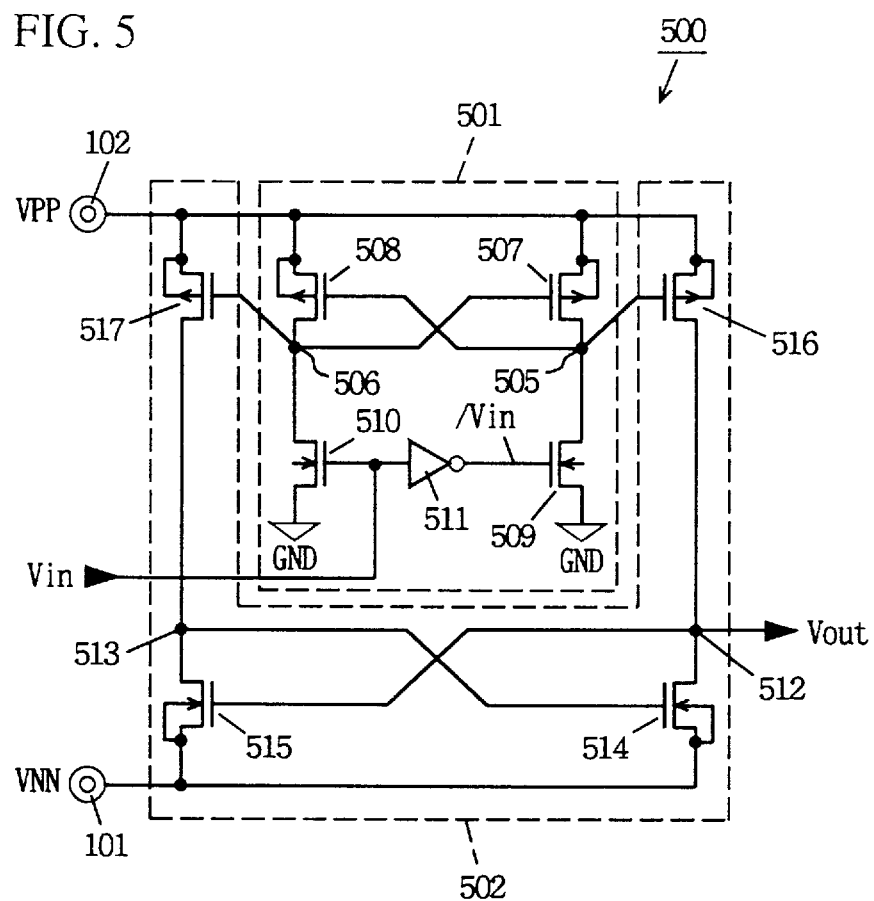

Referring to FIG. 5 of a fourth embodiment of the present invention, a level converter circuit 500 is similar to that of level converter circuit 100 of FIG. 1 provided that its polarity is inverted. Therefore, CVSL circuit 501 of FIG. 5 corresponds to CVSL circuit 103 of FIG. 1, and CVSL circuit 502 of FIG. 5 corresponds to CVSL circuit 104 of FIG. 1. Also, P channel MOS transistor 507 in CVSL circuit 501 corresponds to N channel MOS transistor 107 in CVSL circuit 103, P channel MOS transistor 508 corresponds to N channel MOS transistor 108, N channel MOS transistor 509 corresponds to P channel MOS transistor 109, and N channel MOS transistor 510 corresponds to P channel MOS transistor 110. Furthermore, N channel MOS transistor 514 in CVSL circuit 502 corresponds to P channel MOS transistor 110 in CVSL circuit 104, N channel MOS transistor 515 corresponds to P channel MOS transistor 115, P channel MOS transistor 516 corresponds to N channel MOS transistor 116, and N channel MOS transistor 517 corresponds to N channel MOS transistor 117.

Therefore, CVSL circuit 501 responds to voltage switching signal Vin to selectively provide input voltage VPP and ground voltage GND. CVSL circuit 502 responds to voltage VPP or GND from CVSL circuit 501 to selectively provide input voltages VPP and VNN. Therefore, level converter circuit 500 according to the fourth embodiment of the present invention can supply an output voltage Vout that has an amplitude between a positive VPP level and a negative VNN level.

Fifth Embodiment

Figure 6:
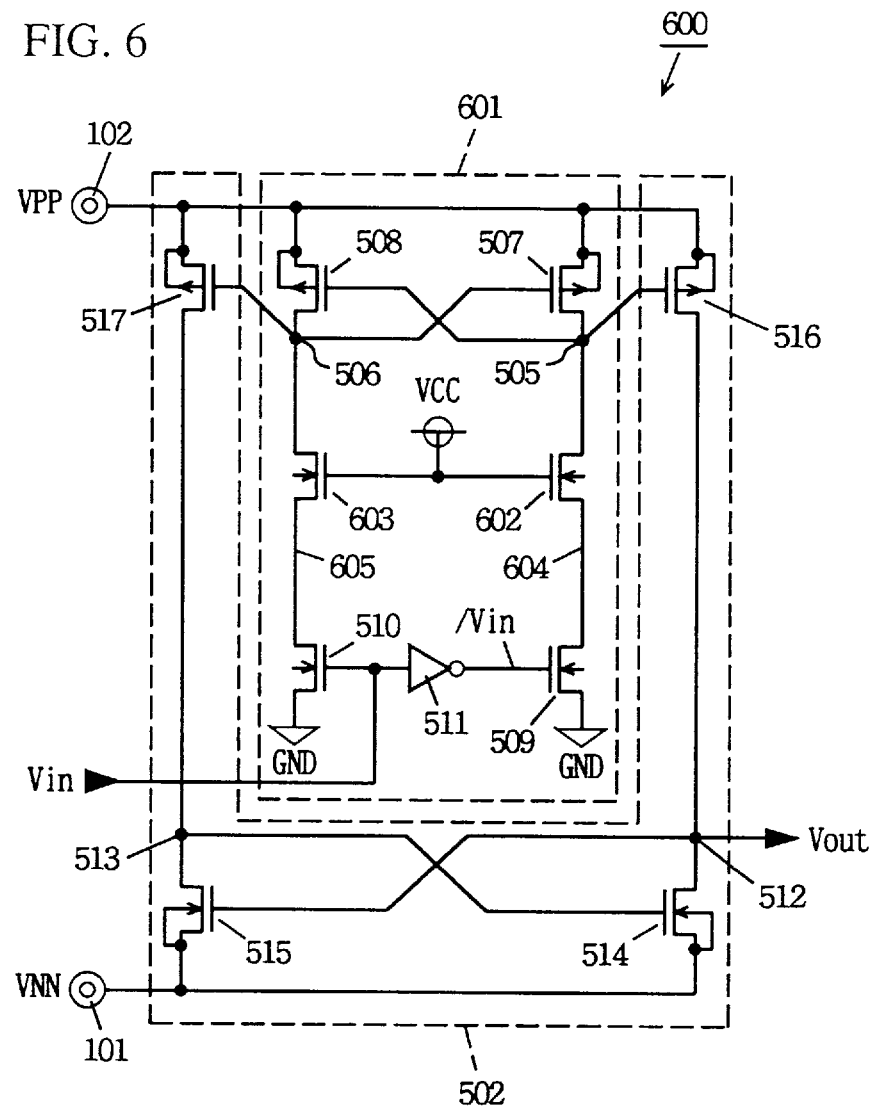

Referring to FIG. 6, a level converter circuit 600 is similar to level converter circuit 300 of FIG. 3 provided that its polarity is inverted. Therefore, a CVSL circuit 601 in level converter circuit 600 includes N channel MOS transistors 602 and 603, in addition to the structure of CVSL 501 of FIG. 5. Power supply voltage Vcc is applied to the gates of N channel MOS transistors 602 and 603.

In level converter circuit 600, the voltage across the source and drain of N channel MOS transistors 509 and 510 is relaxed by N channel MOS transistors 602 and 603.

Sixth Embodiment

Figure 7:
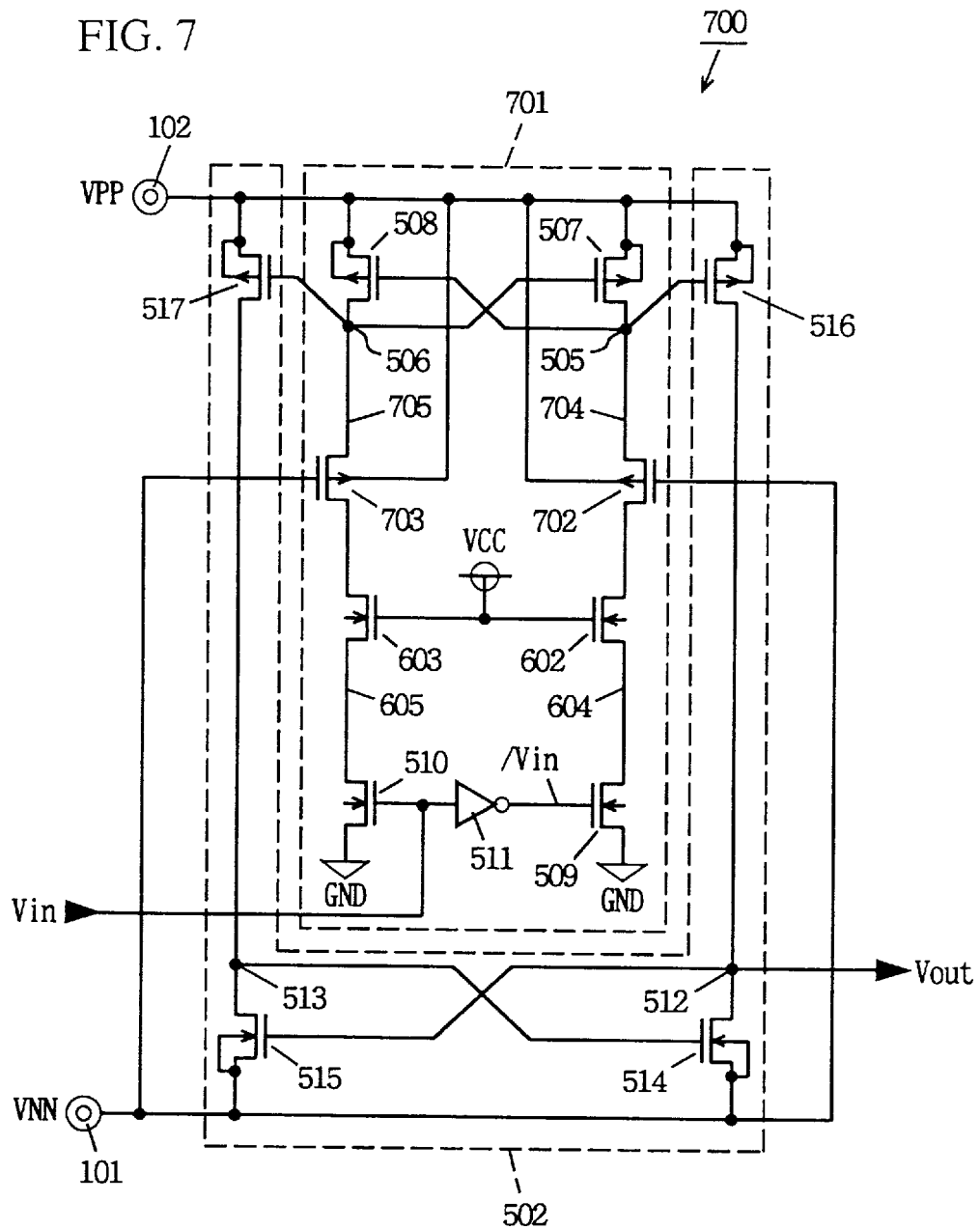

Referring to FIG. 7, a level converter circuit 700 is similar to level converter circuit 400 of FIG. 4 provided that its polarity is inverted. A CVSL circuit 701 in level converter circuit 700 further includes P channel MOS transistors 702 and 703, in addition to the structure of CVSL circuit 601 of FIG. 6. P channel MOS transistor 702 has its gate supplied with input voltage VNN, and its backgate supplied with input voltage VPP. P channel MOS transistor 703 has its gate supplied with input voltage VNN, and its backgate supplied with input voltage VPP.

In level converter circuit 700, the voltage across the source and drain of P channel MOS transistors 507 and 508 is relaxed by P channel MOS transistors 702 and 703. N channel MOS transistors 602 and 603 may be omitted.

Seventh Embodiment

Figure 8:
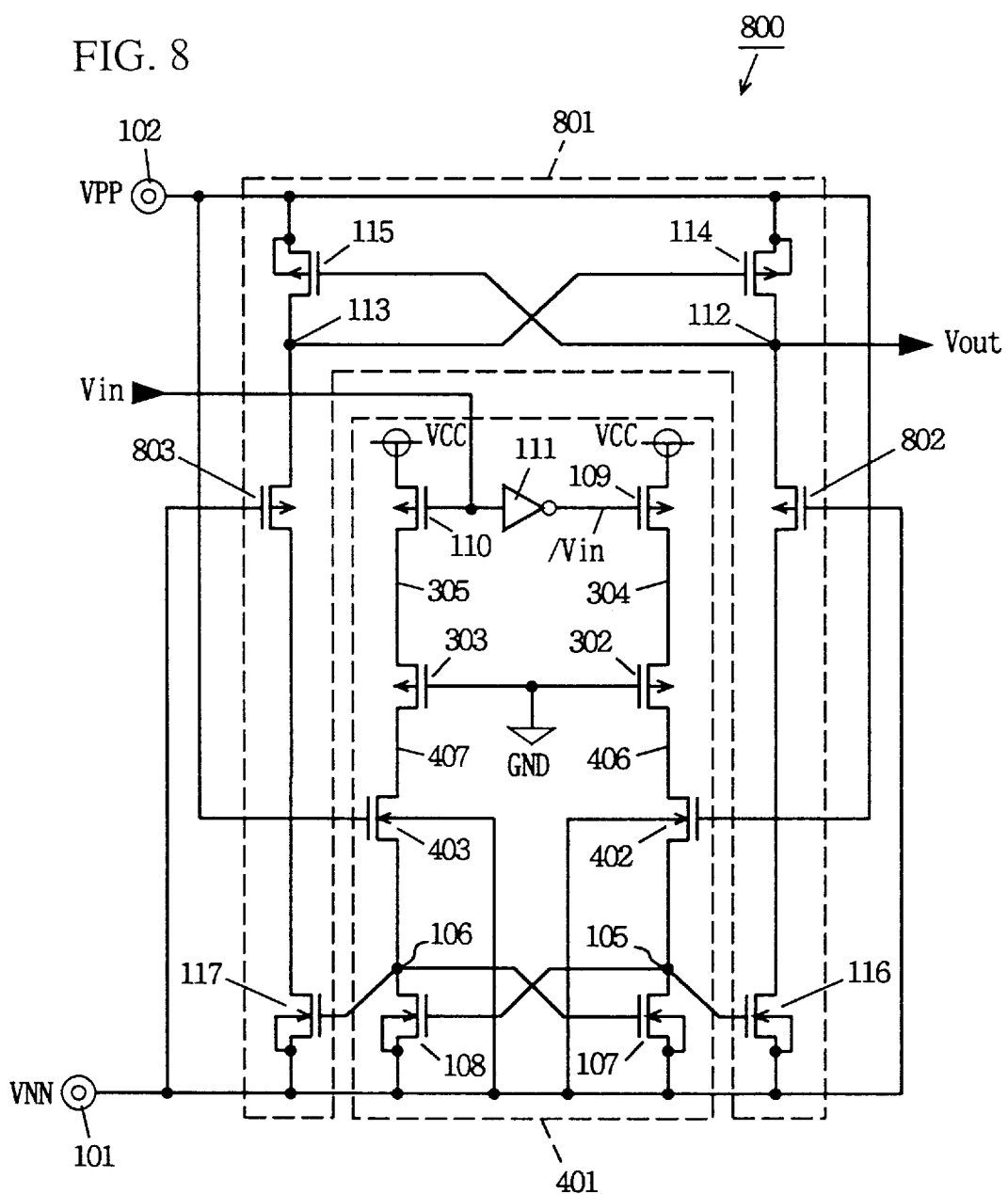

FIG. 8 shows a structure of a level converter circuit according to a seventh embodiment of the present invention. In addition to the structure of level converter circuit 400 shown in FIG. 4, a level converter circuit 800 of the seventh embodiment further includes a CVSL circuit 801 with P channel MOS transistors 802 and 803. P channel MOS transistor 802 is connected between P channel MOS transistor 114 and N channel MOS transistor 116. P channel MOS transistor 803 is connected between P channel MOS transistor 115 and N channel MOS transistor 117. Input voltage VNN is applied to the gates of P channel MOS transistors 802 and 803.

In level converter circuit 800 of the seventh embodiment, P channel MOS transistors 802 and 803 relax the voltage across the source and drain of P channel MOS transistors 114 and 115.

Eighth Embodiment

Figure 9:
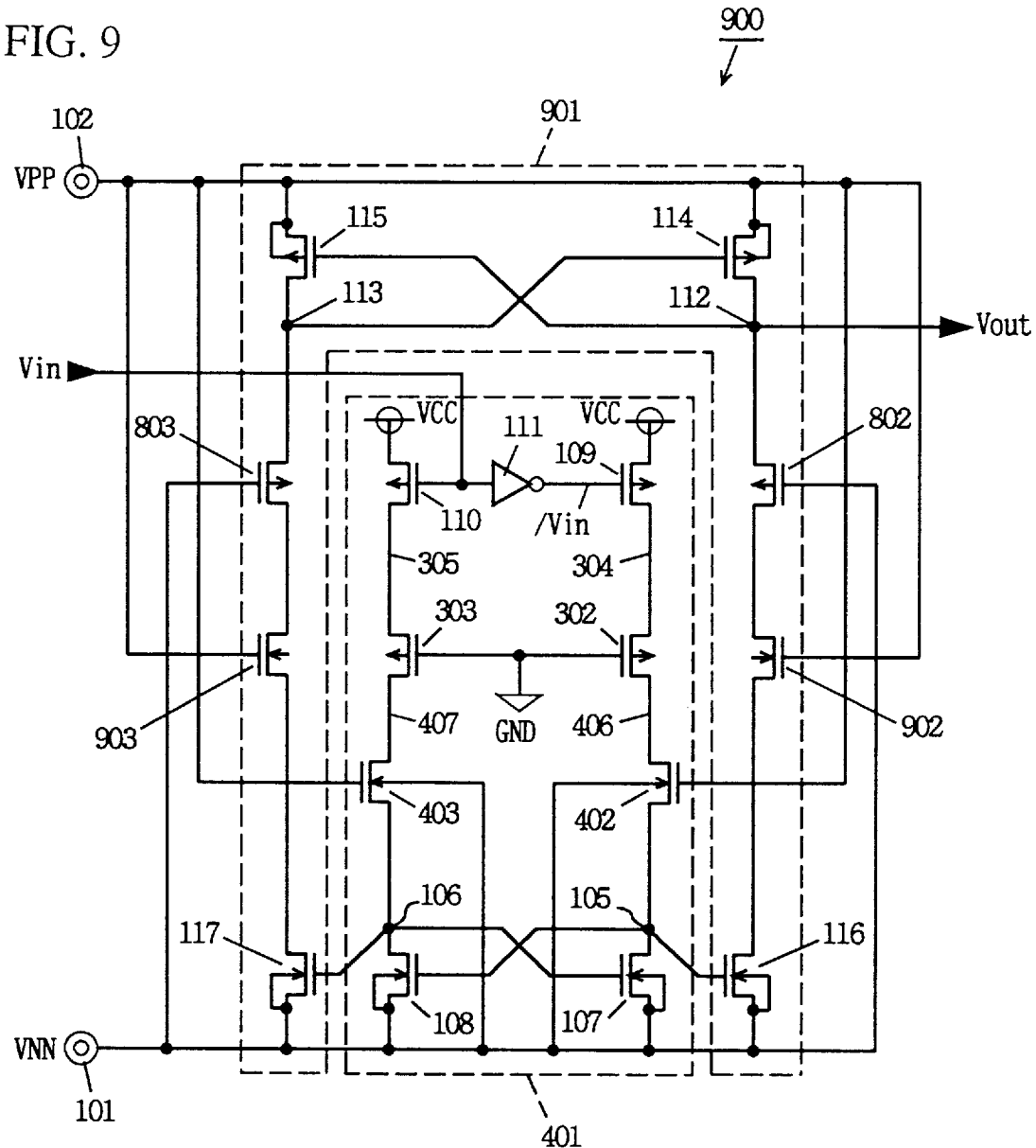

FIG. 9 shows a structure of a level converter circuit according to an eighth embodiment of the present invention. In addition to the structure of level converter circuit 800 shown in FIG. 8, a level converter circuit 900 of the eighth embodiment has a CVSL circuit 901 further including N channel MOS transistors 902 and 903. N channel MOS transistor 902 is connected between P channel MOS transistor 802 and N channel MOS transistor 116. N channel MOS transistor 903 is connected between P channel MOS transistor 803 and N channel MOS transistor 117. Input voltage VPP is applied to both the gates of N channel MOS transistors 902 and 903.

In level converter circuit 900, N channel MOS transistors 902 and 903 relax the voltage across the source and drain of N channel MOS transistors 116 and 117.

In the present eighth embodiment, P channel MOS transistors 802 and 803 may be omitted. Also, N channel MOS transistors 402 and 405 may be omitted. Furthermore, P channel MOS transistors 302 and 303 may be omitted.

Ninth Embodiment

As shown in Tables 2–4, voltage switching signal Vin of a selected state attains an H level (3.3V), and voltage switching signal Vin of a de-selected state attains the level of an L level (0V), only in the case of a program operation mode. In other words, the above-described level converter circuit operates in positive logic in a program operation mode. In erase and read operation modes, voltage switching signal Vin of a selected state attains an L level (0V) and voltage switching signal Vin of a de-selected state attains an H level (3.3V). In other words, the above-described level converter circuit operates in negative logic in erase and read operation modes. However, control of a level converter circuit so that the positive logic and the negative logic are switched according to an operation mode is tedious. Therefore, an object of the ninth embodiment is to facilitate control of a level converter circuit.

Figure 10:
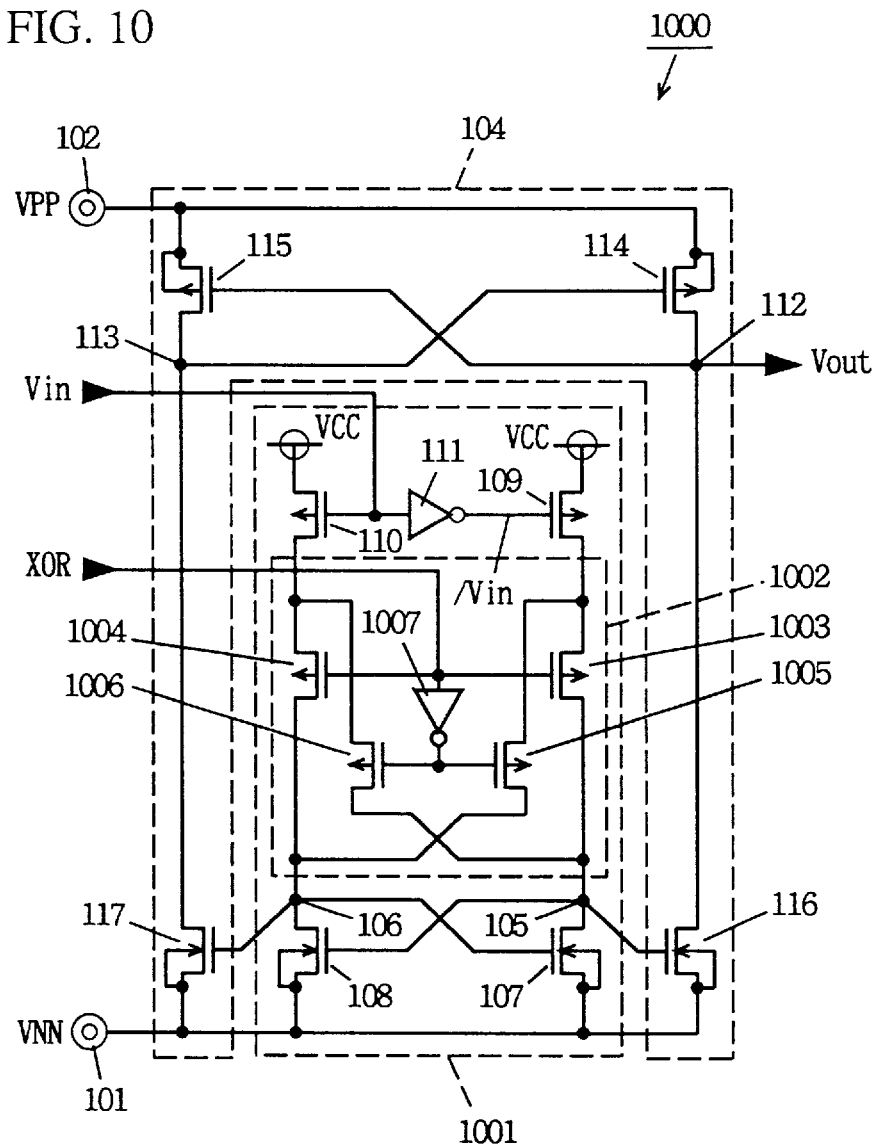

FIG. 10 shows a level converter circuit according to a ninth embodiment of the present invention. In addition to the structure of level converter circuit 100 shown in FIG. 1, a level converter circuit 1000 has a CVSL circuit 1001 further including a switching circuit 1002. Switching circuit 1002 switches between a first state in which the drain of P channel MOS transistor 109 is connected to node 105 and the drain of P channel MOS transistor 110 is connected to node 106, and a second state in which the drain of P channel MOS transistor 109 is connected to node 106 and the drain of P channel MOS transistor 110 is connected to node 105 in response to a logic switching signal XOR.

More specifically, switching circuit 1002 includes P channel MOS transistors 1003 and 1004, P channel MOS transistors 1005 and 1006, and an inverter 1007 for inverting the logic of logic switching signal XOR. P channel MOS transistor 1003 is connected between node 105 and the drain of P channel MOS transistor 109 to be turned on/off in response to logic switching signal XOR. P channel MOS transistor 1004 is connected between node 106 and the drain of P channel MOS transistor 110 to be turned on/off in response to logic switching signal XOR. P channel MOS transistors 1005 is connected between node 106 and the drain of P channel MOS transistor 109 to be turned on/off in response to a signal complementary to logic switching signal XOR. P channel MOS transistor 1006 is connected between node 105 and P channel MOS transistor 110 to be turned on/off in response to a signal complementary to logic switching signal XOR.

Since logic switching signal XOR attains an H level in a program operation mode, P channel MOS transistors 1003 and 1004 are turned off, and P channel MOS transistors 1005 and 1006 are turned on. As a result, the drain of P channel MOS transistor 109 is connected to node 106, and the drain of P channel MOS transistor 110 is connected to node 105. Therefore, the logic of level converter circuit 1000 of such a state attains a logic opposite to that of level converter circuit 100 shown in FIG. 1.

In an operation mode other than a program operation mode, i.e. in erase and read operation modes, logic switching signal XOR attains an L level, whereby P channel MOS transistors 1003 and 1004 are turned on and P channel MOS transistors 1005 and 1006 are turned off. As a result, the drain of P channel MOS transistor 109 is connected to node 105, and the drain of P channel MOS transistor 110 is connected to node 106. Therefore, the logic of level converter circuit 1000 in such a state is opposite to that of level converter circuit 100 shown in FIG. 1.

In addition to the above-described logic switching function, P channel MOS transistors 1005 and 1006 function to relax the voltage across the source and the drain of P channel MOS transistors 109 and 110 in a program operation mode. In erase and read operation modes, P channel MOS transistors 1003 and 1004 function to relax the voltage across the source and drain of P channel MOS transistors 109 and 110 in addition to the above-described logic switching function.

Since level converter circuit 1000 of the ninth embodiment includes a switching circuit 1002 that has the logic switched according to an operation mode, control of level converter circuit 1000 is facilitated.

Tenth Embodiment

Figure 11:
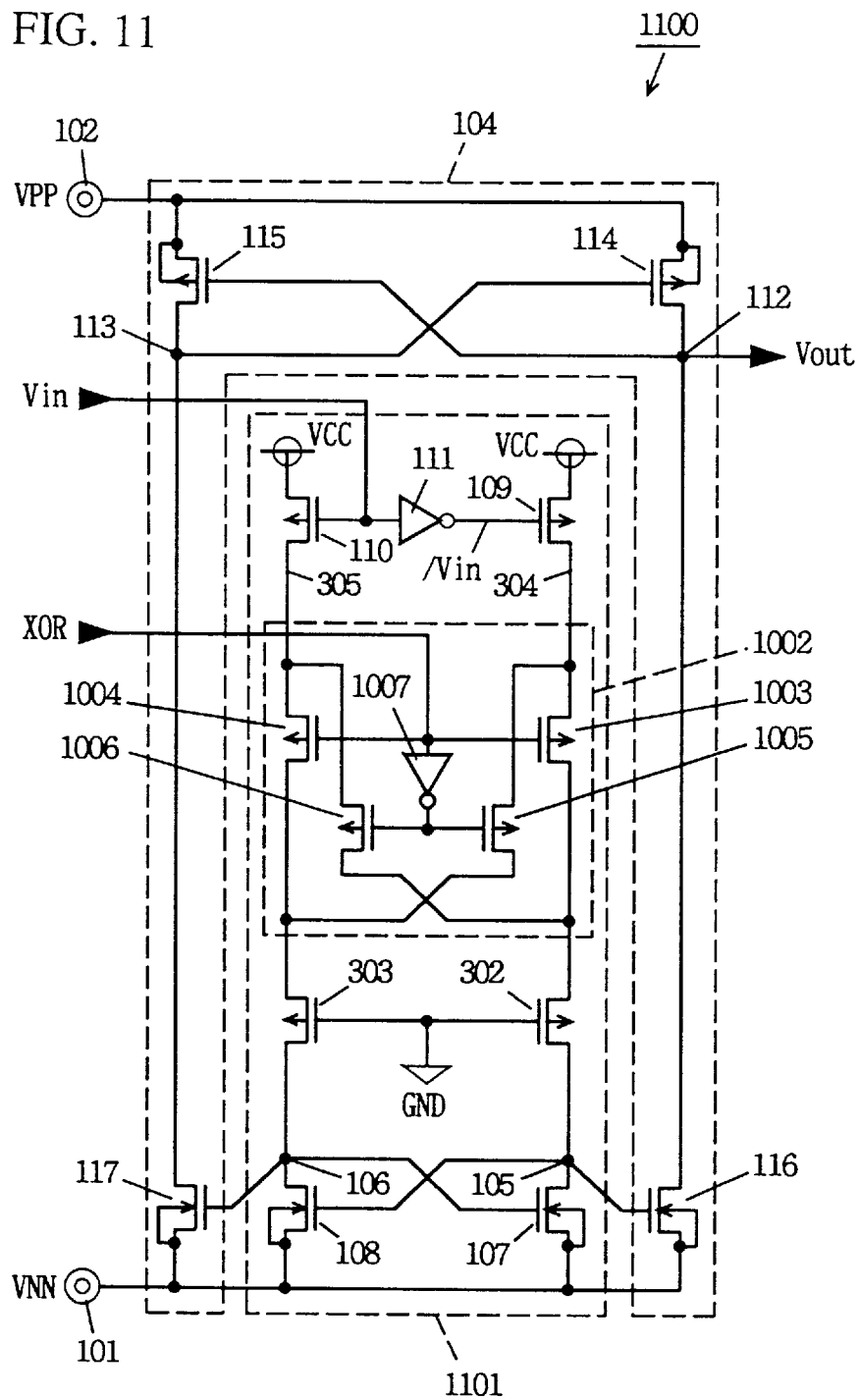

FIG. 11 shows a structure of a level converter circuit according to a tenth embodiment of the present invention. In addition to the structure of level converter circuit 1000 shown in FIG. 10, a level converter circuit 1100 has a CVSL circuit 1101 including P channel MOS transistors 302 and 303. In other words, level converter circuit 1100 includes a CVSL circuit 1101 with a switching circuit 1002, in addition to the structure of level converter circuit 300 shown in FIG. 3.

Since level converter circuit 1100 according to the tenth embodiment of the present embodiment includes P channel MOS transistors 302 and 303, the voltage across the source and drain of P channel MOS transistors 109 and 110 is relaxed. Furthermore, since level converter circuit 1100 includes switching circuit 1002, the positive logic and the negative logic can be switched according to an operation mode.

Eleventh Embodiment

Figure 12:
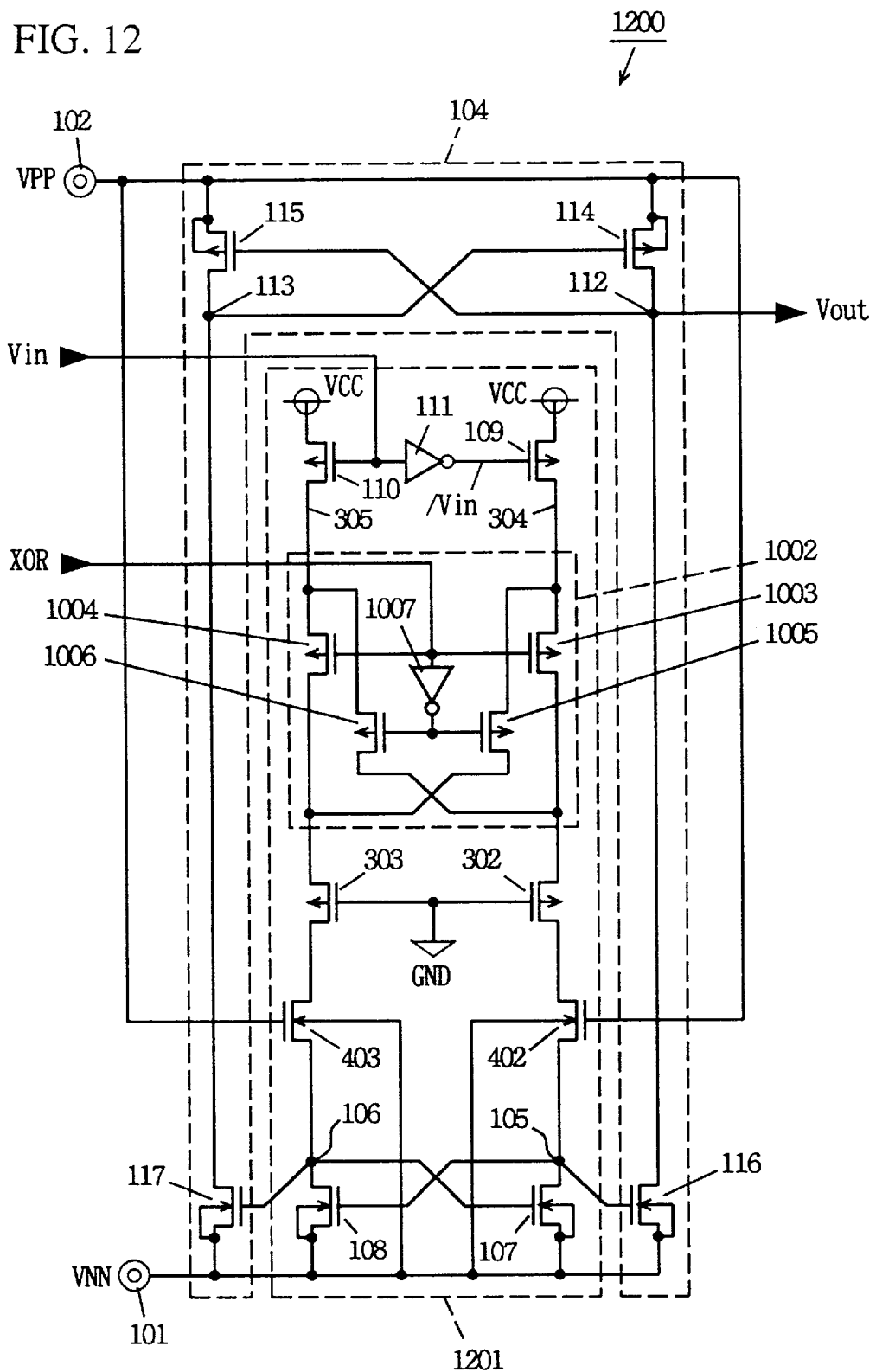

FIG. 12 shows a structure of a level converter circuit according to an eleventh embodiment of the present invention. In addition to the structure of level converter circuit 1100 shown in FIG. 11, a level converter circuit 1200 has a CVSL circuit 1201 including N channel MOS transistors 402 and 403. More specifically, level converter circuit 1201 has a CVSL circuit 1201 including a switching circuit 1002, in addition to the structure of level converter circuit 400 shown in FIG. 4.

Since level converter circuit 1200 of the eleventh embodiments includes N channel MOS transistors 402 and 403, the voltage across the source and drain of N channel MOS transistors 107 and 108 is relaxed. Furthermore, the positive logic and the negative logic can be switched according to an operation mode since level converter circuit 1200 includes a switching circuit 1002.

Since P channel MOS transistors 1003 and 1004 or P channel MOS transistors 1005 and 1006 relax the voltage across the source and drain of P channel MOS transistors 109 and 110, P channel MOS transistors 302 and 303 may be omitted.

Twelfth Embodiment

Figure 13:
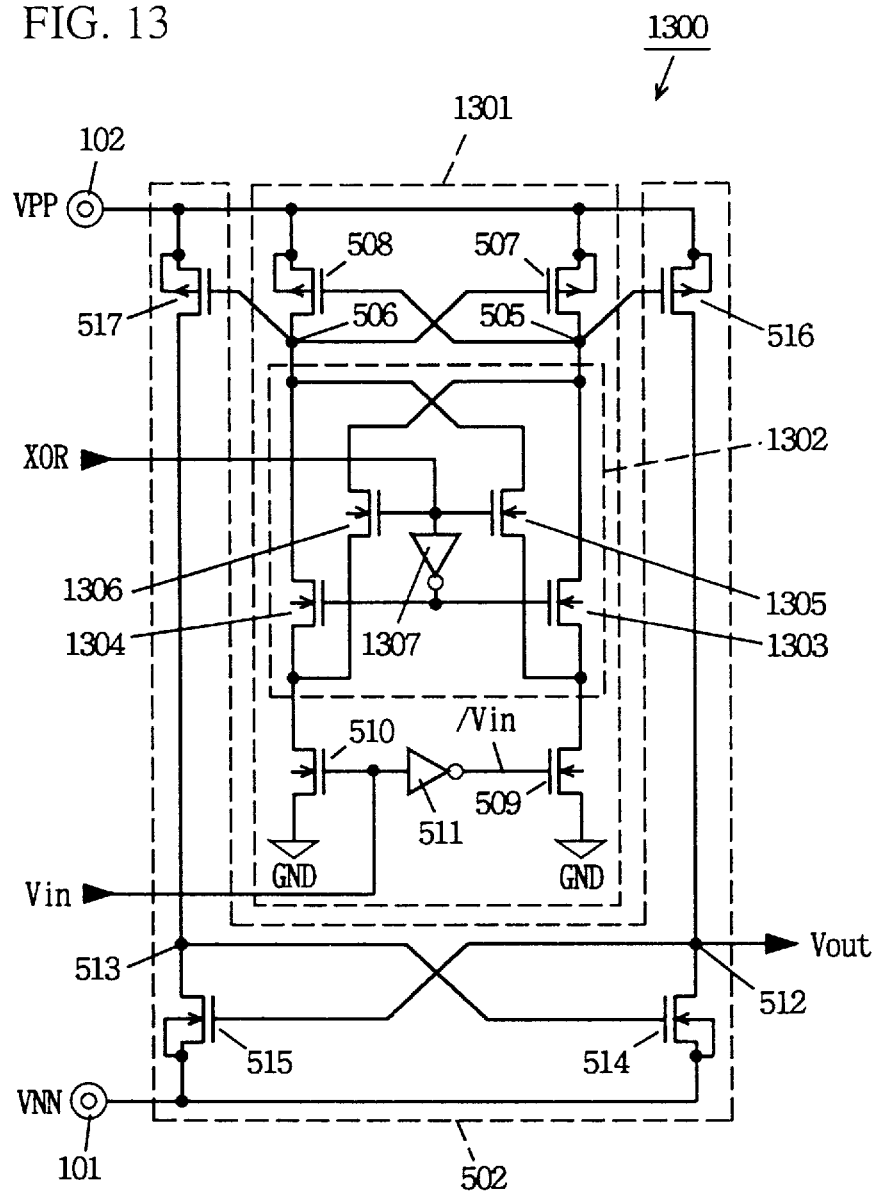

Referring to FIG. 13, a level converter circuit 1300 according to a twelfth embodiment of the present invention is similar to level converter circuit 1000 of FIG. 12 provided that its polarity is inverted. More specifically, in addition to the structure of level converter circuit 500 of FIG. 5, level converter circuit 1300 includes a CVSL circuit 1301 with a switching circuit 1302.

Switching circuit 1302 switches between a first state in which the drain of N channel MOS transistor 509 is connected to a node 505 and the drain of N channel MOS transistor 510 is connected to node a 506, and a second state in which the drain of N channel MOS transistor 509 is connected to node 506 and the drain of N channel MOS transistor 510 is connected to node 505 in response to logic switching signal XOR.

More specifically, switching circuit 1302 includes N channel MOS transistors 1302–1306, and an inverter 1307. N channel MOS transistor 1303 is connected between node 505 and the drain of N channel MOS transistor 509 to be turned on/off in response to a signal complementary to logic switching signal XOR. N channel MOS transistor 1304 is connected between node 506 and the drain of N channel MOS transistor 510 to be turned on/off in response to a signal complementary to logic switching signal XOR. N channel MOS transistor 1305 is connected between node 506 and the drain of N channel MOS transistor 509 to be turned on/off in response to logic switching signal XOR. N channel MOS transistor 1306 is connected between node 505 and the drain of N channel MOS transistor 510 to be turned on/off in response to logic switching signal XOR.

Since level converter circuit 1300 includes switching circuit 1302 according to a twelfth embodiment of the present invention, the positive logic and the negative logic can be switched according to the operation mode.

Furthermore, since level converter circuit 1300 includes N channel MOS transistors 1303–1306, the voltage across the source and drain of N channel MOS transistors 509 and 510 is relaxed.

Thirteenth Embodiment

Figure 14:
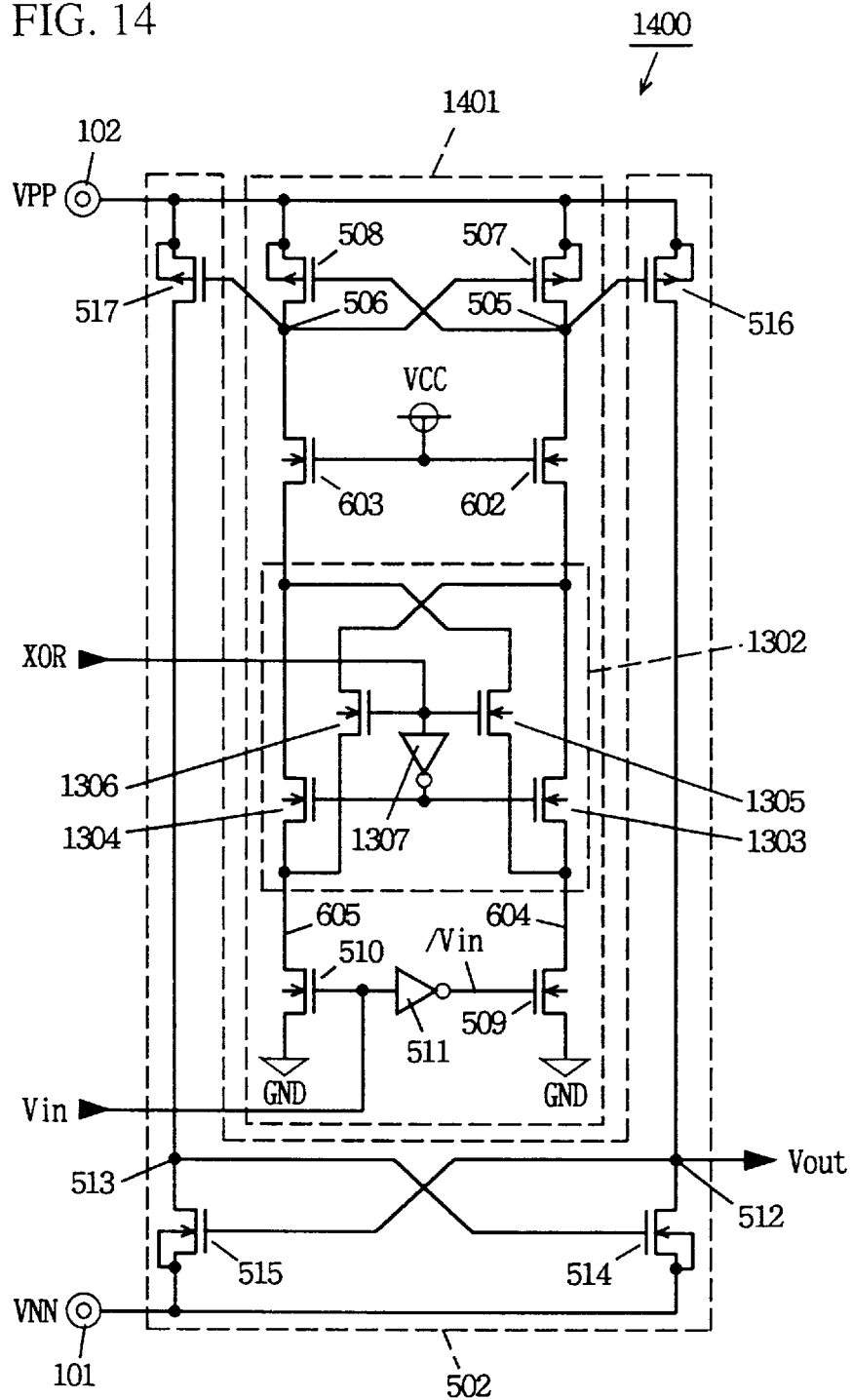

FIG. 14 shows a structure of a level converter circuit according to a thirteenth embodiment of the present invention. In addition to the structure of level converter circuit 1300 of FIG. 13, a level converter circuit 1400 has a CVSL circuit 1401 including N channel MOS transistors 602 and 603. More specifically, level converter circuit 1400 includes a switching circuit 1302 in addition to the structure of level converter circuit 600 of FIG. 6.

Since level converter circuit 1400 of the thirteenth embodiment of the present invention includes switching circuit 1302, the positive logic and the negative logic can be switched according to the operation mode.

Furthermore, since level converter circuit 1400 includes N channel MOS transistors 602 and 603, the voltage across the source and drain of N channel MOS transistors 509 and 510 is relaxed.

Fourteenth Embodiment

Figure 15:
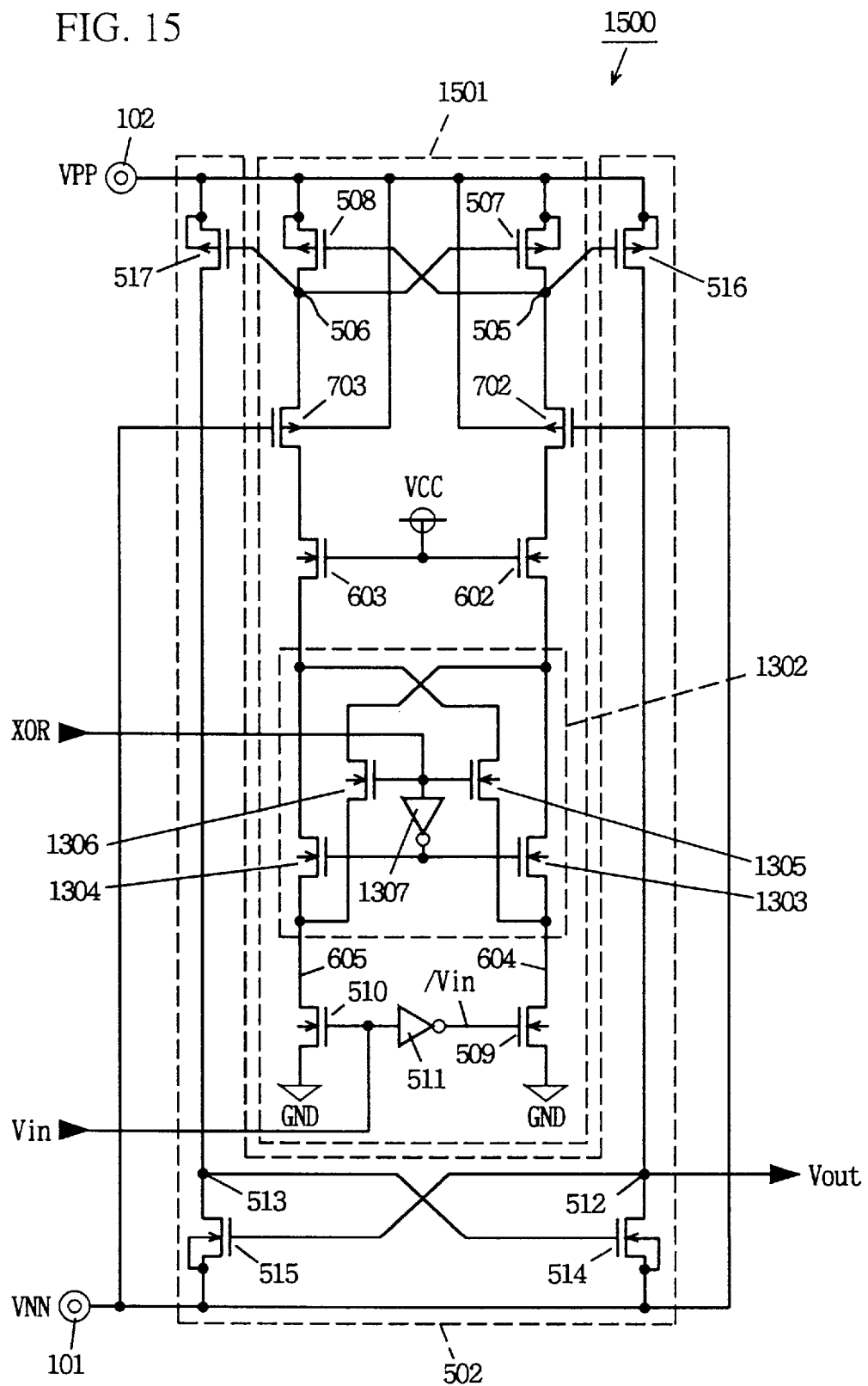
Figure 16:
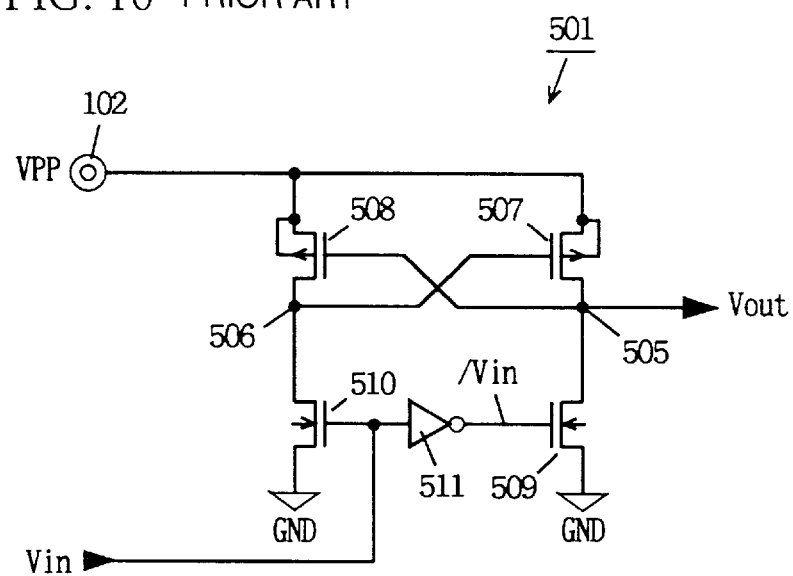
FIG. 16 is a circuit diagram showing an example of a structure of a conventional level converter circuit.

FIG. 15 shows a structure of a level converter circuit according to a fourteenth embodiment of the present invention. In addition to the structure of level converter circuit 1400 of FIG. 14, a level converter circuit 1500 of the fourteenth embodiment has a CVSL circuit 1501 including P channel MOS transistors 702 and 703. In other words, level converter circuit 1500 has a CVSL circuit 1501 including switching circuit 1302, in addition to the structure of level converter circuit 700 of FIG. 7.

Since level converter circuit 1500 of the fourteenth embodiment includes switching circuit 1302, the positive logic and the negative logic can be switched according to the operation mode.

Since level converter circuit 1500 includes P channel MOS transistors 702 and 703, the voltage across the source and drain of P channel MOS transistors 507 and 508 is relaxed.

Furthermore, since N channel MOS transistors 1303–1306 relax the voltage across the source and drain of N channel MOS transistors 509 and 510, N channel MOS transistors 602 and 603 may be omitted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level converter circuit comprising:
a first node,
a second node,
a first MOS transistor having a source receiving a first voltage, a drain connected to said first node, and a gate connected to said second node,
a second MOS transistor having a source receiving said first voltage, a drain connected to said second node, and a gate connected to said first node,
a third MOS transistor having a source receiving a second voltage, and responsive to a voltage switching signal to be turned on/off,
a fourth MOS transistor having a source receiving said second voltage, and turned on/off in complementary to said third MOS transistor,
switching means for switching between a first state in which the drain of said third MOS transistor is connected to said first node and the drain of said fourth MOS transistor is connected to said second node, and a second state in which the drain of said third MOS transistor is connected to said second node and the drain of said fourth MOS transistor is connected to said first node in response to a logic switching signal,
a third node,
a fourth node,
a fifth MOS transistor having a source receiving a third voltage, a drain connected to said third node, and a gate connected to said fourth node,
a sixth MOS transistor having a source receiving said third voltage, a drain connected to said fourth node, and a gate connected to said third node,
a seventh MOS transistor having a source receiving said first voltage, a drain connected to said third node, and a gate connected to said first node, and
an eighth MOS transistor having a source receiving said first voltage, a drain connected to said fourth node, and a gate connected to said second node.

2. The level converter circuit according to claim 1, wherein said switching means comprises
a ninth MOS transistor connected between said first node and the drain of said third MOS transistor, and responsive to said logic switching signal to be turned on/off,
a tenth MOS transistor connected between said second node and the drain of said fourth MOS transistor, and turned on when said ninth MOS transistor is turned on and turn off when said ninth MOS transistor is turned off,
an eleventh MOS transistor connected between said second node and the drain of said third MOS transistor, and turned off when said ninth MOS transistor is turned on and turned on when said ninth MOS transistor is turned off, and
a twelfth MOS transistor connected between said first node and the drain of said fourth MOS transistor, and turned on when said eleventh MOS transistor is turned on and turned off when said eleventh MOS transistor is turned off.

3. A level converter circuit comprising:
a first cascade voltage switch logic circuit receiving a first voltage and a second voltage higher than said first voltage, and responsive to a voltage switching signal for selectively providing said first or second voltage, and
a second cascade voltage switch logic circuit receiving a third voltage higher than said first voltage and lower than said second voltage, and said first voltage, and responsive to the first or second voltage provided from an output of said first cascade voltage switch logic circuit for selectively providing said first or third voltage, wherein
said first cascade voltage switch logic circuit comprises
a first node,
a second node,
a first MOS transistor having a source receiving said first voltage, a drain connected to said first node, and a gate connected to said second node,
a second MOS transistor having a source receiving said first voltage, a drain connected to said second node, and a gate connected to said first node,
a third MOS transistor having a source receiving said second voltage being and responsive to said voltage switching signal for being turned on/off, and
a fourth MOS transistor having a source receiving said second voltage and being turned on/off in complementary to said third MOS transistor,
wherein said second cascade voltage switch logic circuit comprises
a third node,
a fourth node,
a fifth MOS transistor having a source receiving said third voltage, a drain connected to said third node and a gate connected to said fourth node,
a sixth MOS transistor having a source receiving said third voltage, a drain connected to said fourth node, and a gate connected to said third node,
a seventh MOS transistor having a source receiving said first voltage, a drain connected to said third node, and a gate connected to said first node,
an eighth MOS transistor having a source receiving said first voltage, a drain connected to said fourth node, and a gate connected to said second node, wherein
said first cascade voltage switch logic circuit further comprises
a ninth MOS transistor having a terminal connected to said first node and a gate receiving said third voltage,
a tenth MOS transistor having a terminal connected to said second node and a gate receiving said third voltage,
an eleventh MOS transistor connected between the drain of said third MOS transistor and another terminal of said ninth MOS transistor and having a gate receiving a fourth voltage higher than said third voltage, and a twelfth MOS transistor connected between the drain of said fourth MOS transistor and another terminal of said tenth MOS transistor and having a gate receiving said fourth voltage.

4. A level converter circuit comprising:

a first cascade voltage switch logic circuit receiving a first voltage and a second voltage lower than said first voltage, and responsive to a voltage switching signal for selectively providing said first or second voltage, and a second cascade voltage switch logic circuit receiving a third voltage lower than said first voltage and higher than said second voltage, and said first voltage, and responsive to the first or second voltage provided from an output of said first cascade voltage switch logic circuit for selectively providing said first or third voltage, wherein said first cascade voltage switch logic circuit comprises a first node, a second node, a first MOS transistor having a source receiving said first voltage, a drain connected to said first node, and a gate connected to said second node, a second MOS transistor having a source receiving said first voltage, a drain connected to said second node, and a gate connected to said first node, a third MOS transistor having a source receiving said second voltage and responsive to said voltage switching signal for being turned on/off, and a fourth MOS transistor having a source receiving said second voltage and being turned on/off in complementary to said third MOS transistor, wherein said second cascade voltage switch logic circuit comprises a third node, a fourth node, a fifth MOS transistor having a source receiving said third voltage, a drain connected to said third node and a gate connected to said fourth node, a sixth MOS transistor having a source receiving said third voltage, a drain connected to said fourth node, and a gate connected to said third node, a seventh MOS transistor having a source receiving said first voltage, a drain connected to said third node, and a gate connected to said first node, an eighth MOS transistor having a source receiving said first voltage, a drain connected to said fourth node, and a gate connected to said second node, wherein said first cascade voltage switch logic circuit further comprises a ninth MOS transistor having a terminal connected to said first node and a gate receiving said third voltage, a tenth MOS transistor having a terminal connected to said second node and a gate receiving said third voltage, an eleventh MOS transistor connected between the drain of said third MOS transistor and another terminal of said ninth MOS transistor and having a gate receiving a fourth voltage lower than said third voltage, and a twelfth MOS transistor connected between the drain of said fourth MOS transistor and another terminal of said tenth MOS transistor and having a gate receiving said fourth voltage.

* * * * *

UNITED STATES PATENT AND TRADEMARK OFFICE
CERTIFICATE OF CORRECTION

PATENT NO. : 5,872,476
DATED : February 16, 1999
INVENTOR(S) : Masaaki Mihara, et al It is certified that error appears in the above-identified patent and that said Letters Patent is hereby corrected as shown below:

[*] Notice: This patent issued on a continued prosecution application filed under 37 CFR 1.53 (d), and is subject to the twenty year patent term provisions of 35 U.S.C. 154(a)(2).

Signed and Sealed this

Thirty-first Day of October, 2000

Attest:

Q. TODD DICKINSON

Attesting Officer     Director of Patents and Trademarks